US007595808B2

(12) United States Patent
Shih et al.

(10) Patent No.: US 7,595,808 B2
(45) **Date of Patent: *Sep. 29, 2009**

(54) METHOD AND APPARATUS FOR UPDATING A COLOR LOOK-UP TABLE

(75) Inventors: Guang-Ting Shih, San Jose, CA (US); Jay Li, Milpitas, CA (US); Steven Tseng, Fremont, CA (US); Chengfuh Jeffrey Tang, Saratoga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/955,047

(22) Filed: Sep. 30, 2004

(65) Prior Publication Data

US 2005/0179697 A1 Aug. 18, 2005

Related U.S. Application Data

(63) Continuation of application No. 10/289,077, filed on Nov. 6, 2002, now Pat. No. 6,819,331.

(60) Provisional application No. 60/361,230, filed on Mar. 1, 2002.

(51) Int. Cl.

| | |
|---|---|
| ***G09G 5/02*** | (2006.01) |
| ***G09G 5/36*** | (2006.01) |
| ***H04N 5/44*** | (2006.01) |
| ***H04N 9/69*** | (2006.01) |
| ***G06K 9/00*** | (2006.01) |
| ***G03F 3/08*** | (2006.01) |

(52) U.S. Cl. ........................ 345/602; 345/589; 345/593; 345/600; 345/549; 348/557; 348/675; 358/518; 382/162; 382/167

(58) Field of Classification Search ................. 345/597, 345/600–602, 593, 589, 547–549; 348/557, 348/560, 562, 675; 358/518–524; 382/162–167
See application file for complete search history.

(56) References Cited

U.S. PATENT DOCUMENTS

| | | | | | |
|---|---|---|---|---|---|
| 4,857,901 | A * | 8/1989 | Lathrop | ...................... | 345/601 |
| 5,838,389 | A * | 11/1998 | Mical et al. | ................. | 348/650 |
| 6,417,891 | B1 * | 7/2002 | Cacciatore et al. | .......... | 348/649 |
| 6,745,390 | B1 * | 6/2004 | Reynolds et al. | .............. | 725/39 |
| 2004/0101194 | A1 * | 5/2004 | Dawson | ...................... | 382/162 |

* cited by examiner

*Primary Examiner*—Wesner Sajous
(74) *Attorney, Agent, or Firm*—McAndrews, Held & Malloy, Ltd.

(57) ABSTRACT

Aspects of the invention may include a method updating a color look-up table (CLUT) for a next line of graphics before a current line of graphics has been completely read out of a graphics FIFO and assigned color pixel values. The method may include the step of formatting or arranging the CLUT into a plurality of sub-CLUTs. Each one of the sub-CLUTs may include pixel color values for each one of a plurality of pixels which may include a line of the graphics image data. Pixel color values may be read from within a first selected sub-CLUT, the first selected sub-CLUT comprising pixel color values for a first line of the graphics image data. The read pixel color value may be applied to the current first line of the graphics image data. While the read pixel color value is being applied to the current first line, pixel color values for a second selected sub-CLUT may be updated. The second selected sub-CLUT may include color pixel values for a second line of the graphics image data.

30 Claims, 3 Drawing Sheets

METHOD AND APPARATUS FOR UPDATING A COLOR LOOK-UP TABLE

CROSS-REFERENCE TO RELATED APPLICATIONS/INCORPORATION BY REFERENCE

The present application is a Continuation of U.S. Non-Provisional Patent Application having Ser. No. 10/289,077, filed on Nov. 06, 2002, now U.S. Pat. No. 6,819,331 entitled METHOD AND APPARATUS FOR UPDATING A COLOR LOOK-UP TABLE and hereby incorporates herein by reference the complete subject matter of thereof in its entirety.

The present application also claims the benefit of U.S. Provisional Application No. 60/361,230 filed on Mar. 1, 2002, the complete subject matter of which is hereby incorporated herein by reference in its entirety.

BACKGROUND OF THE INVENTION

Certain embodiments of the present invention relate generally to digital graphics processing. More specifically, certain embodiments relate to a method and apparatus for updating a color look-up table (CLUT).

Currently, several graphical image file formats exists. Some of these graphical image file formats may be machine dependent, operating system (OS) dependent or cross-platform independent. Notwithstanding, graphic image file format translators exists that may transform images from one file format to another. Some of the most popular graphical file format may include, but are not limited to, joint photographic expert group (JPEG), graphic interchange format (GIF), tagged image file format (TIFF), bitmap (BMP) and motion picture expert group (MPEG). JPEG, GIF, TIFF, and BMP, may generally be utilized for still graphic images, while MPEG may generally be utilized for moving graphic images.

It may often be necessary to reduce the size of an original image to ensure that any resulting image file may be small enough to require a minimal amount of storage. Additionally, the smaller the size of an image, the faster it may be transferred and/or displayed on a video display terminal. In general, graphic image file formats may incorporate some form of compression technique or scheme, which may effectively reduce the size of the image. These compression techniques may be lossy or lossless. Lossy compression techniques may reduce the size of an original image by removing actual image data from the original image. In this regard, a noticeable degradation may occur in the quality of any resulting image. Although, the resulting image may differ from the original image, in few instances, the difference may not be readily discernible by the human eye. Lossless compression techniques may reduce the size of an original image by utilizing certain algorithms that may permit the original image to be reproduced without any loss of the original image data. In this regard, the resulting image may differ from the original image, but in some instances, the difference may not be readily discernible.

Even though compression techniques may be used to compress graphic images, graphics processors may have to decompress some image file formats before actual images may be displayed on a display terminal such as a video display terminal. Significant amounts of processing power may be required, even in cases that may utilize dedicated graphics processing elements. These graphics processing elements may include, but are not limited to, graphics engines and graphics processors or coprocessors. A similar situation may apply in cases where the graphic image or data may not be in a compressed format.

To reduce processing requirements, some systems may utilize a color look-up table (CLUT). A CLUT may be a table stored in memory that may contain representative pixel information that may be utilized for reproduction and display of a graphic image. The CLUT may be viewed as a compression scheme in which pixel values for a bitmap image may be used as an index into a color translation table. Entries in the color translation table may define colors that may have more bits per pixel than the pixel values used to represent the bitmap image. For example, a system that utilizes four (4) bits to represent a pixel may have a CLUT with $2^4$ or sixteen (16) possible values. However, there may be two (2) or more CLUTs, thereby extending the number of colors beyond sixteen (16) that may be represented by the four (4) bits. Similarly, a system that utilizes eight (8) bits to represent a pixel may have a CLUT with $2^8$ or two hundred and fifty six (256) possible values. However, there may be two (2) or more CLUTs, thereby extending the number of colors that may be represented by the eight (8) bits significantly beyond two hundred and fifty six (256). In this case, if there are n CLUTs, then 256n colors may possibly be represented. Notwithstanding, one drawback with such a scheme would be the vast amount of memory that would be required to store the CLUT. Additionally, extensive amounts of processing power may be required to, for example, read and update the CLUT.

In systems that utilize a CLUT, buffers containing graphic data may be utilized for displaying a line of graphics at a time. In this regard, at least those portions of buffers containing information for a current line of graphics image data may be flushed or overwritten once a current line of graphics data has been displayed. The CLUT containing pertinent information about the pixels for the current line being displayed may only be updated after the information for the current line has been displayed. Hence, the CLUT containing information for the current line being displayed may not be updated prior to completion of the display of the current line, since doing so would result in at least a partial destruction of any existing graphic image being displayed. Accordingly, a need exists for an approach to update a color look-up table (CLUT) for a next line of graphics before the current line of graphics is finished being read out of a FIFO and processed for color.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Embodiments of the present invention may provide a method and system for updating a color look-up table (CLUT) for a next line of graphics before a current line of graphics has been completely read out of a graphics FIFO and assigned color pixel values. The method may include the step of formatting or arranging the CLUT into a plurality of sub-CLUTs. Each one of the sub-CLUTs may include pixel color values for each one of a plurality of pixels which may include a line of the graphics image data. Pixel color values may be read from within a first selected sub-CLUT, the first selected sub-CLUT comprising pixel color values for a first line of the graphics image data. The read pixel color value may be applied to the current first line of the graphics image data. While the read pixel color value is being applied to the current first line, pixel color values for a second selected sub-CLUT may be updated. The second selected sub-CLUT may include color pixel values for a second line of the graphics image data.

The method may also include the step of assigning a corresponding CLUT index to each of the sub-CLUTs within the formatted CLUT and assigning a corresponding pixel data index to each of the pixel color values located with the sub-CLUT. The step of reading the pixel color value may further include the step of selecting the assigned sub-CLUT index of the sub-CLUT for the first line of graphics image data. The assigned pixel data index of the read pixel color value may be selected for the current line of the graphics image data.

The step of assigning a corresponding sub-CLUT index to each of the sub-CLUTs within the formatted CLUT may also include the step of assigning an n-bit value to represent a maximum number of the sub-CLUTs within the formatted CLUT. The maximum number of sub-CLUTs may be $2^n$, wherein n may be 4 or 8. The step of assigning a corresponding pixel data index to each of the pixel color values located within the sub-CLUT may further include the step of assigning an n-bit value to represent a maximum number of the pixel color values located with the sub-CLUT. The maximum number of the pixel color values may be $2^n$, where n may be 4 or 8.

Another aspect of the invention may include machine-readable storage, having stored thereon a computer program having a plurality of code sections executable by a machine for causing the machine to perform the above-mentioned steps.

Another embodiment of the invention may include a system for updating pixel colors in a color look-up-table (CLUT) being applied to graphics image data. The system may include a plurality of sub-CLUTs formatted within the CLUT. Each one of the plurality of sub-CLUTs may provide pixel color values for each one of a plurality of pixels comprising a line of the graphics image data. At least one reader may be adapted for reading pixel color values from within a first selected sub-CLUT. The first selected sub-CLUT may include pixel color values for a first line of the graphics image data. The at least one reader may be adapted to apply the read pixel color value to the current first line of the graphics image data. The at least one reader may also be configured to update pixel color values for a second selected sub-CLUT simultaneously with the at least one reader applying the read pixel color value to the current first line. The second selected sub-CLUT may include color pixel values for a second line of the graphics image data.

The system may also include a sub-CLUT index assigned to a corresponding one of each of the sub-CLUTs within the formatted CLUT. A sub-CLUT index may also be assigned to a corresponding one of each of the pixel color values located with the sub-CLUT. The system reader for reading the pixel color value may further include at least one selector for selecting the assigned CLUT index of the sub-CLUT for the first line of graphics image data. The selector may also be adapted to select the assigned sub-CLUT index of the read pixel color value for the current line of the graphics image data.

In accordance with the invention, the sub-CLUT index assigned to a corresponding one of each of the sub-CLUTs within the formatted CLUT, may further include an n-bit value assigned to represent a maximum number of the sub-CLUTS within the formatted CLUT. The maximum number of sub-CLUTS may be $2^n$, where n may be 4 or 8. The sub-CLUT index assigned to a corresponding one of each of the pixel color value located with the sub-CLUT may further include an n-bit value assigned to represent a maximum number of the pixel color values located with the sub-CLUT. The maximum number of pixel color values may be $2^n$, where n maybe 4 or 8.

These and other advantages, aspects and novel features of the present invention, as well as details of an illustrated embodiment thereof, will be more fully understood from the following description and drawings.

DETAILED DESCRIPTION OF THE INVENTION

Aspects of the invention provide a system and method for updating a color look-up table (CLUT) for a next line of graphics before the current line of graphics is finished being read out of a graphics FIFO and having colors applied from the CLUT.

Figure 1:
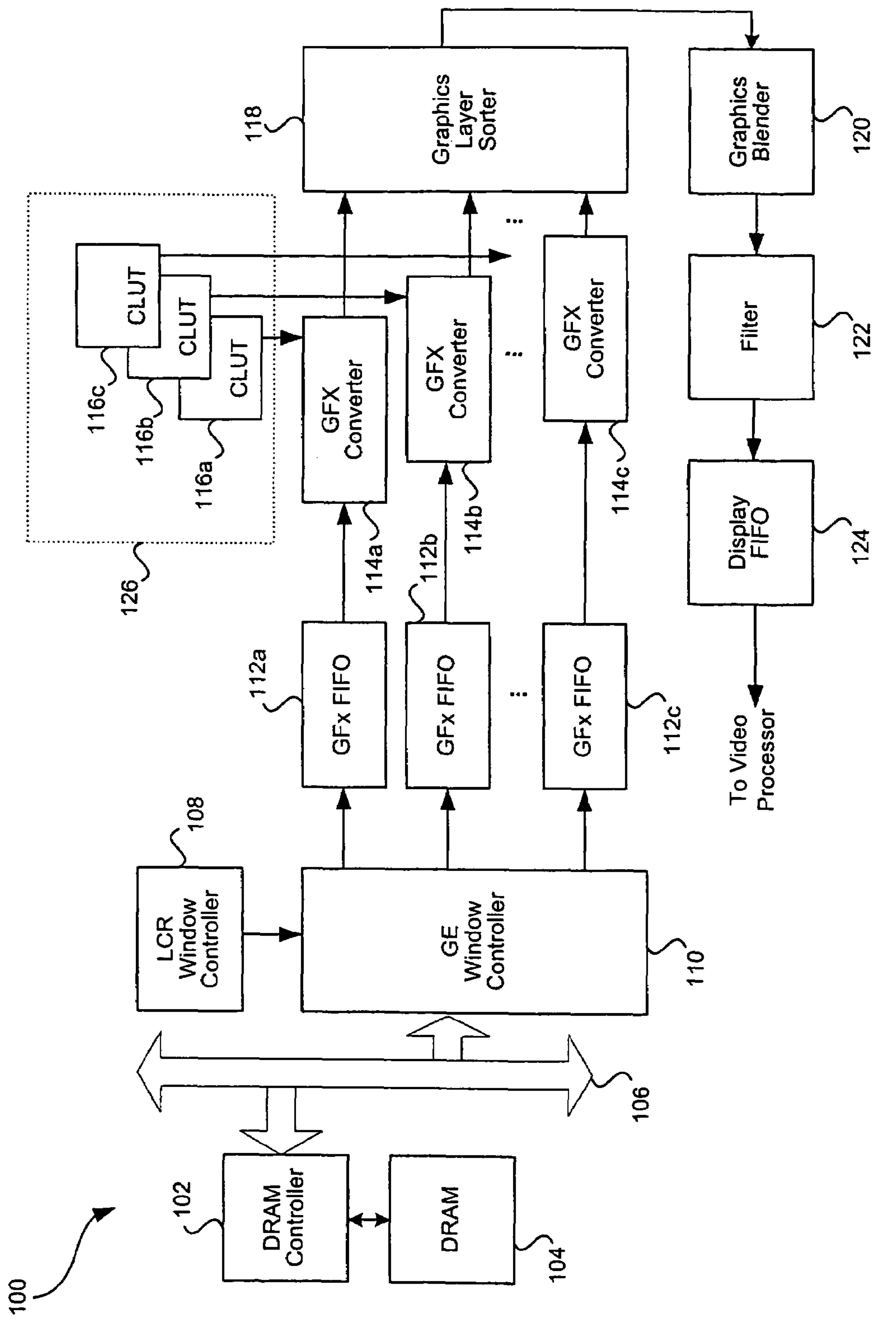
FIG. 1 is a block diagram of an apparatus for updating a CLUT associated with a graphics FIFO in accordance with an embodiment of the invention.

FIG. 1 is a block diagram 100 of an apparatus for updating a CLUT associated with a graphics FIFO in accordance with an embodiment of the present invention. Referring to FIG. 1, block diagram 100 may include a DRAM controller 102, a DRAM 104, a bus 106, a line control register (LCR) window controller 108, a graphics engine (GE) window controller 110, graphics (GFx) first-in-first-out (FIFO) buffers 112*a*, 112*b*, 112*c*, graphics converters 114*a*, 114*b*, 114*c*, and CLUTs 116*a*, 116*b*, 116*c*. FIG. 1 may also include a graphics layer sorter 118, a graphics blender 120, a filter block 122 and a display FIFO buffer block 124. Although block diagram 100 may include: DRAM controller 102 and DRAM 104, the invention may not be limited in this regard. Accordingly, any suitable memory or video random access memory (VRAM), controlled by a suitable memory controller or processor may be utilized. The CLUTs 116*a*, 116*b*, 116*c* may be formatted as a data structure and stored in a memory 126 and/or DRAM 104. Memory 126 may be an SRAM, although the invention is not so limited.

DRAM controller 102 may be coupled to bus 106 and the DRAM 104 may be coupled to the DRAM controller 102 in any suitable manner such as is conventionally known. GE window controller 110 may be coupled to bus 106. The LCR window controller 108 may be coupled to the GE window controller 110. The GE window controller 110 may be adapted to control a plurality of graphics FIFO buffers 112*a*, 112*b*, 112*c*. In this regard, various outputs of the GE window controller 110 may be coupled to an input of each of the graphics FIFOs 112*a*, 112*b*, 112*c*. The output of each of the graphic FIFOs 112*a*, 112*b*, 112*c* may be coupled to an input of a corresponding graphics converter 114*a*, 114*b*, 114*c*. Each graphics converter 114*a*, 114*b*, 114*c* may be adapted to be associated with a corresponding CLUT 116*a*, 116*b*, 116*c*. In this arrangement, there may be a one-to-one association between a graphics FIFO, its corresponding graphics converter and its corresponding CLUT. For example, an output of graphics FIFO 112*a* may be coupled to an input of graphics converter 114*a*, which may have an associated corresponding CLUT 116*a*. An output of graphics FIFO 112*b* may be coupled to an input of graphics converter 114*b*, which may have an associated corresponding CLUT 116*b*. An output of graphics FIFO 112*c* may be coupled to an input of graphics converter 114*c*, which may have an associated corresponding CLUT 116*c*.

An output of each of the graphics converters 114*a*, 114*b*, 114*c* may be coupled to one or more inputs of graphics layer sorter 118. Graphics blender 120 may be adapted to receive an output of the graphics layer sorter 118. An output of the graphics blender 120 may be coupled to a filter block 122, which may include at least one filter element. The output of the filter block 122 may be coupled to an input of display FIFO block 124. The display FIFO block 124 may include one or more display FIFO buffers. Finally, an output of the display FIFO 124 may be coupled to a video-processing element such as a video processor (not shown).

DRAM 104 may be adapted to store graphics image data. The DRAM controller 102 may be configured to control the transfer of graphics image data to and from the DRAM 104 via, for example, bus 106. In one embodiment of the invention, DRAM controller 102 may be used to control the transfer of graphics image data from the DRAM 104 to the GE window controller 110. The GE window controller 110 may be adapted to control a manner in which graphics image may be displayed over the complete viewing portion of a video display terminal. GE window controller 110 may be adapted to control display attributes for the viewable portion of the video display terminal such as the display height, display width, aspect ratio and any special formatting. LCR window controller 108 may be adapted to control a manner in which each line of the viewing portion of the video display terminal may be displayed. LCR window controller 108 may be adapted to control line attributes for each line to be displayed on the video display terminal. These attributes may include, but are not limited to, the start of a line, the end of a line and any special formatting that the line may possess. Each of the graphics FIFO buffers 112*a*, 112*b*, 112*c* may be adapted to store graphics image data for a particular line to be display on the video display terminal.

Each of the corresponding graphics converters 114*a*, 114*b*, 114*c* may be adapted to interpret graphics image data received from the connected graphics FIFO. Based on the received graphics image data, each of the graphics converters 114*a*, 114*b*, 114*c* may consult their associated corresponding CLUT 116*a*, 116*b*, 116*c* respectively, to acquire color information pertaining to a particular pixel for a line to be displayed. For example, based on the graphics image data for a particular line received from graphics FIFO 112*a*, graphics converter 114*a* may consult its associated corresponding CLUT 116*a* to acquire color information pertaining to a particular pixel for the line to be displayed. Based on the graphics image data for a particular line received from graphics FIFO 112*b*, graphics converter 114*b* may consult its associated corresponding CLUT 116*b* to acquire color information pertaining to a particular pixel for the line to be displayed. Finally, based on the graphics image data for a particular line received from graphics FIFO 112*c*, graphics converter 114*c* may consult its associated corresponding CLUT 116*a* to acquire color information pertaining to a particular pixel for the line to be displayed.

Graphics layer sorter 118 may be adapted to receive processed output graphics image data from the graphics converters 114*a*, 114*b*, 114*c* and may accordingly sort various portions of the graphic image for overlay based on the data received from the graphic converters 114*a*, 114*b*, 114*c*. In this regard, graphics layer sorter 118 may be adapted to add spatial depth to the processed image data. Graphics blender 120 may receive a sorted layer output from the graphics layer sorter 118 and accordingly merge or overlay the various layers of the graphics image.

Filter block 122 may include one or more post-processing filters that may be adapted to filter out any unwanted or undesirable effects. For example, filter block 122 may include a post-processing filter that may be adapted to filter out any unwanted high frequency distortion that may distort at least a portion of an output graphic image. The output of the filter block 122 may be buffered in display FIFO 124 before being transferred to a video processor or engine for processing. The video processor or engine may, for example, encode the graphics display data received from the display FIFO 124 in a format suitable for display on the video display terminal. In this regard, the video processor or engine may encode the graphics display in a format such as national television system committee (NTSC), phase alternate line (PAL) and sequential color and memory (SECAM).

Figure 2:
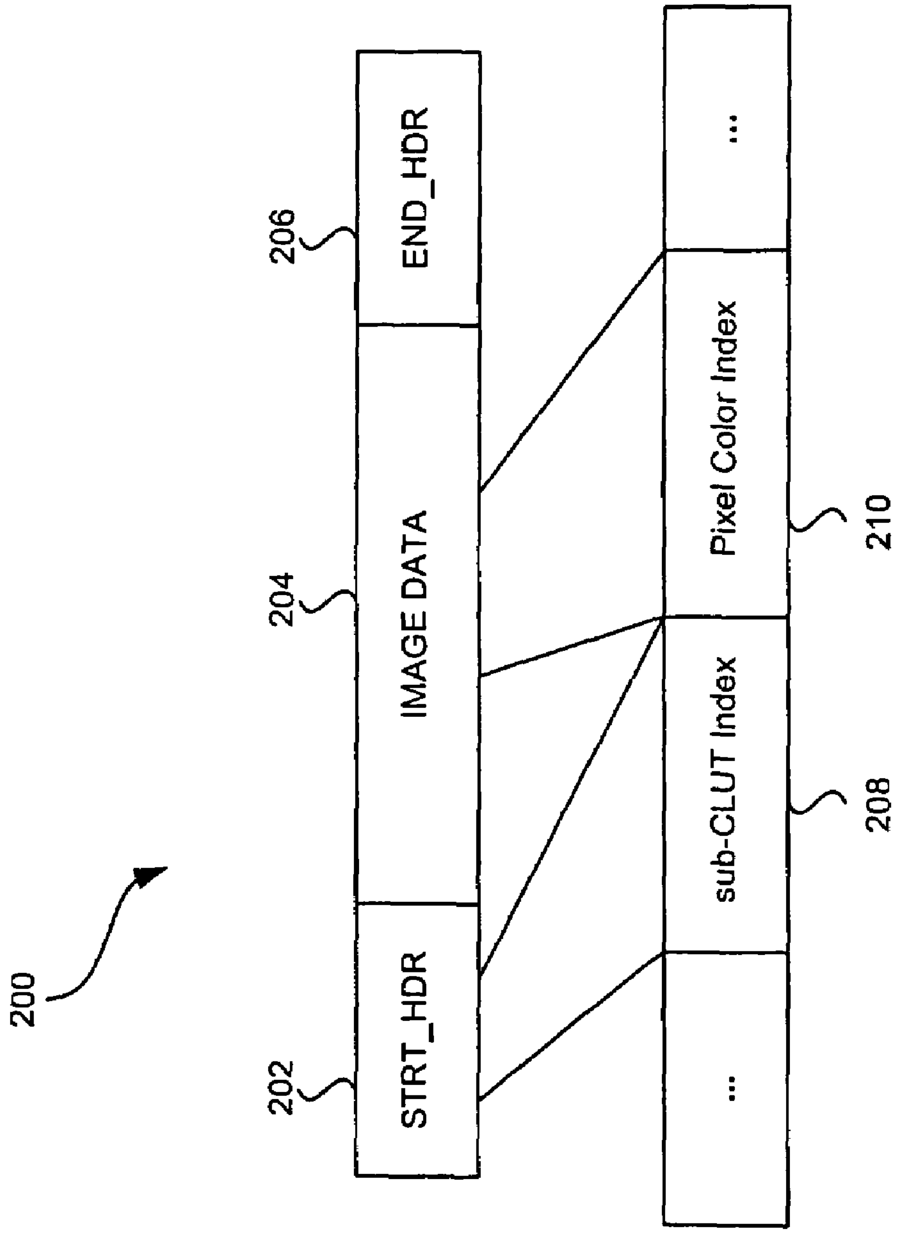
FIG. 2 is an exemplary format for graphics image data that may be used to represent a line in accordance with the invention.

FIG. 2 is an exemplary format for the graphics image data 200 that may be used to represent a line in accordance with the invention. Referring to FIG. 2, graphics image data 200 may include at least three (3) fields, namely a start header (STRT_HDR) field 202, image data field 204, and an end header (END_HDR) field 206. The STRT_HDR field 202 may have a plurality of fields which may include a sub-CLUT index 208.

The STRT_HDR field 202 may include information regarding which sub-CLUT may be utilized for a particular image data. In this regard, STRT_HDR field 202 may include a pointer to the start of the CLUT in SRAM. The image data field 204 may contain digital information which may represent the graphics image. The END_HDR field 206 may contain a pointer that may indicate the end of an image in a line.

The sub-CLUT index 208, which may be located in the STRT_HDR 202, may contain at least a first 4-bit field which may be used as an index into a CLUT to locate a group or sub-CLUT within the CLUT. The pixel data index 210, which may be located in the image data field 204, may contain a second 4-bit field which may be used as an index into the sub-CLUT to locate the position of the 32-bit pixel color value 306 which may designate the color of a particular pixel. Although the sub-CLUT index 208 may be 4-bit field and the pixel data index 210 may be a 4-bit field, the invention is not so limited. It should be recognized that the sub-CLUT index 208 and the pixel color index 210 may be placed in either the STRH_HDR field 202, the image data field 204 or the END_HDR field without departing from the spirit of the invention.

In accordance with an embodiment of the invention, the CLUTs 114*a*, 114*b*, 114*c* may be arranged for example, as a 32×256 memory bank such as a 32×256 SRAM. In this case, each of the CLUTs 114*a*, 114*b*, 114*c* may include 256 entries of 32 bits each. In one aspect of the invention, the 256 entries may be organized as 16 groups of 16 entries each, although the invention may not be limited in this regard. Each of the 16 groups of 16 entries may correspond to a particular line of graphics data. Each group may be viewed as a sub-CLUT. Hence, in this case, a CLUT may contain sixteen (16) sub-CLUTs, with each sub-CLUT representing information for a line of display. Therefore, for a particular line of graphics image data, there may be sixteen (16) possible colors which may be used to represent each pixel in the particular line of graphics image data. In one aspect of the invention, each color may be defined by 32 bits, of which 24 bits may be true color bits and a remaining 8 bits are control bits such as alpha bits. In this arrangement, the CLUT 114*a* may define 16 unique sets of colors, which may correspond to 16 different lines of a graphics image at a particular time.

Figure 3:
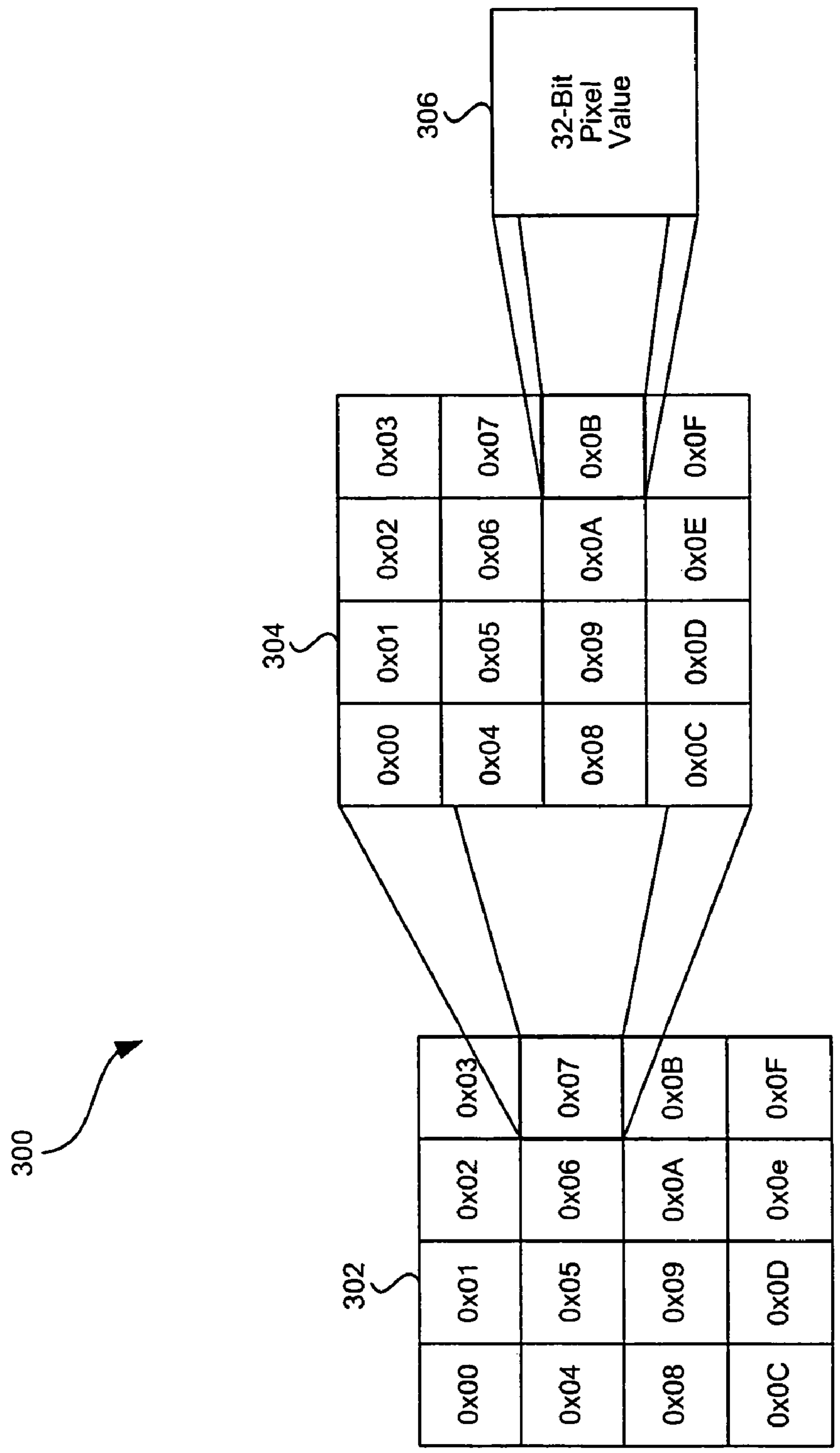
FIG. 3 is an exemplary arrangement of a CLUT in accordance with an embodiment of the invention.

FIG. 3 is an exemplary arrangement of a CLUT 300 in accordance with an embodiment of the invention. Referring to FIG. 3, there is shown a CLUT 302 having sixteen (16) sub-CLUTS labeled 00-0F in hexadecimal format. Each of the sub-CLUTs 00-0F may represent a line for the video display terminal. Accordingly, CLUT 302 may represent 16 lines graphics image data for the video display terminal. Sub-CLUT 0x07 304 may be expanded as shown. In this case, sub-CLUT 0x07 may include sixteen entries labeled 0x00-0x0F in hexadecimal (HEX) notation. Each of the entries 0x00-0x0F of sub-CLUT 0x07 304 may contain a 32-bit value 306 that may represent a color for a particular pixel. In one aspect of the invention, an index may be used to identify a particular 32-bit value for a particular pixel. For example, 0x07:0x0B may be used to represent a particular 32-bit pixel value 306 located in position 0x0B of sub-CLUT 0x07.

During operation, under control of DRAM controller 102 and/or GE window controller 110, graphics window descriptor or LCR list may be loaded into GE window controller 110 and LCR window controller 108 from DRAM, then according to the window descriptor, graphics image data for a first line of a graphic image may be loaded from DRAM 104 into the graphics FIFO 112*a*. The GE window controller 110 and LCR window controller 108 also determine the location of a CLUT or sub-CLUT in DRAM and read it into on chip CLUT 116*a*, 116*b* and 116*c*. The graphics converter 114*a* may read the STRT_HDR 202 in the graphics FIFO 112*a*, 112*b* and 112*c* to determine which group of the 16 groups or sub-CLUTs in CLUT 114*a* may be utilized for the current line of graphics image data. This may be achieved by reading CLUT index 208 from the STRT_HDR 202, which may be used to identify the appropriate group or sub-CLUT in CLUT 114*a*. For example, if the image data line 7 uses the third sub-CLUT, then the sub-CLUT index of the STRT_HDR 202 used to may be represented by 0011 binary or 0x03 Hex. Importantly, this may immediately identify the group or sub-CLUT, namely sub-CLUT 0x03, as containing the data needed to determine the color of the pixel.

Subsequently, the pixel data index 210 of the image data 204 may be read by the graphics converter 114*a* and used to determine the position in the sub-CLUT that may contain the 32-bit value 306 for the color of the pixel. Therefore, for any given pixel in a given line of graphics data, any of 16 colors identified in a sub-CLUT may be chosen for that pixel, depending on the value located in the sub-CLUT identified by the pixel data index 210 in the image data 204. Accordingly, the 32-bit pixel color value 306 for that pixel may be read from the sub-CLUT and assigned to be applied to the pixel by the graphics converter 114*a*. The pixel color value 306, along with other information such as the window layer information may then be passed to the graphics layer sorter 118 for processing.

After the DRAM controller 102 and/or GE window controller 110 loads the first line of the graphic image, graphics image data for a second line of the graphic image may be loaded from DRAM 104 into the graphics FIFO 112*a*. The graphics converter 114*a* may read a corresponding STRT_HDR 202 in the graphics image data 200 to determine a location of a corresponding sub-CLUT in DRAM and read it into the on chip CLUT 116*a*. Subsequent to reading a corresponding STRT_HDR 202, graphics converter 114*a* may determine an appropriate sub-CLUT within CLUT 114*a* that may be utilized for the next line of graphics image data. This may be achieved by reading sub-CLUT index 208 from the corresponding STRT_HDR 202. Subsequently, graphics converter 114*a* may read a corresponding pixel color index 210 to determine the position in the sub-CLUT that may contain the 32-bit pixel color value 306. Accordingly, the 32-bit pixel color value 306 for that pixel may therefore be read from the sub-CLUT and assigned to the pixel by the graphics converter 114*b*. The pixel color value 306, along with other information such as window layer information may then be passed to the graphics layer sorter 118 for processing.

Graphics layer sorter 118 may process the information for the lines and transfer an output to the graphics blender 120. The graphics blender 120 may process the output of the graphics blender layer sorter 118 and an output of the graphics blender 120 may be filtered by the filter block 122. Once filtered, any resulting signal may be buffered by the display FIFO 124 and subsequently processed by a video display processor. The video display processor may encode the pixel information in a format suitable for display on a video display terminal. Advantageously, by utilizing three separate graphics converter processing paths, more information for more layers may be simultaneously processed, thereby providing enhance performance.

In accordance with the invention, it may be desirable to update or change the pixel color values in a CLUT for the next line of graphics data before the current line of graphics image data has been completely read out of a FIFO. Updating or changing the pixel color values in a CLUT may include the task of overwriting data including current pixel color values stored in the sub-CLUT. Notwithstanding, it may not be desirable to update or overwrite pixel color values for a current line of display before pixels for that line have been applied to the pixel. In accordance with the invention, since each line of graphics image data may have its own associated pixel color values within different sub-CLUTs, the pixel color values in the sub-CLUT for the next line of graphics image data may be updated or overwritten with a different set of pixel color values prior to the current line being completely read out of the FIFO. Notably, pixel color values for any line of graphics image data other than the current line of graphics image data may be updated or overwritten with a different set of pixel color values prior to the current line being completely read out of the FIFO.

The invention may permit the pixel color values associated with the current line of graphics image data to reside in the sub-CLUT while being applied to the pixels of the current line. In this regard, the next sub-CLUT or other sub-CLUTs and their associated pixel color values, may at the same time, be overwritten without affecting the pixel colors being applied to the current line of a graphics image. Therefore, the pixel colors for any next line of graphics data to be processed may be updated in the CLUT while color pixel values are being applied to a current line of graphics image data. Advantageously, delays incurred waiting for the graphics FIFO to be completely read by a graphics converter and pixel color values applied to pixels for the current line before the next line of graphics data may be updated may be significantly reduced. In light of the foregoing, embodiments of the invention may provide a method and system for updating a CLUT for a next line of graphics data before a current line of graphics data is completely read out of a graphics FIFO.

Accordingly, the present invention may be realized in hardware, software, or a combination of hardware and software. The present invention may be realized in a centralized fashion in one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention also may be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

Additionally, while the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing images, the method comprising:

using a graphics processing apparatus for:

updating pixel colors in a color look-up-table (CLUT) being applied to pixels for a graphics image, said updating comprising:

formatting said CLUT into sub-CLUTs, each one of said sub-CLUTs providing pixel color values for each of a plurality of pixels representing a line of said graphics image; and reading said pixel color values from within a first selected sub-CLUT of said CLUT, said pixel color values comprising pixel color values for a first line of said graphics image, while pixel color values for other sub-CLUTs of said CLUT, which are different from said first selected sub-CLUT, are modified during processing of said graphics image.

2. The method according to claim 1, comprising applying the read pixel color values to a current first line of said graphics image.

3. The method according to claim 1, comprising:

assigning a corresponding sub-CLUT index to each of the sub-CLUTs within a formatted CLUT; and assigning a corresponding pixel data index to each of the pixel color values located with a sub-CLUT.

4. The method according to claim 3, wherein reading pixel color values comprises:

selecting an assigned sub-CLUT index of the CLUT for a first line of said graphics image; and selecting an assigned pixel data index of read pixel color values for a current line of said graphics image.

5. The method according to claim 3, wherein assigning a corresponding sub-CLUT index to each of the sub-CLUTs within a formatted CLUT comprises assigning an n-bit value to represent a maximum number of sub-CLUTs within the formatted CLUT, the maximum number of sub-CLUTs having a value of $2^n$, wherein n is selected from one of 4 and 8.

6. The method according to claim 3, wherein assigning a corresponding pixel data index to each of the pixel color values located with a sub-CLUT comprises assigning an n-bit value to represent a maximum number of the pixel color values located with the sub-CLUT, the maximum number of the pixel color values having a value of $2^n$, wherein n is selected from one of 4 and 8.

7. A method for processing images, the method comprising:

using a graphics processing apparatus for:

updating pixel colors in a color look-up-table (CLUT) being applied to pixels for a graphics image, said updating comprising:

applying read pixel color values from a single sub-CLUT of said CLUT to a current first line of said graphics image, wherein the single sub-CLUT of said CLUT provides pixel color values for each one of a plurality of pixels representing a single line of said graphics image, while pixel color values for other sub-CLUTs of said CLUT, which are different from said single sub-CLUT of said CLUT, are modified during processing of said graphics image.

8. The method according to claim 7, comprising:

formatting the CLUT into sub-CLUTs, each one of the sub-CLUTs providing pixel color values for each one of a plurality of pixels comprising a line of said graphics image; and reading pixel color values from within a first selected sub-CLUT of said CLUT, the first selected sub-CLUT of said CLUT comprising pixel color values for a first line of said graphics image.

9. The method according to claim 8, wherein reading the pixel color values comprises:

selecting an assigned sub-CLUT index of the CLUT for a first line of said graphics image; and selecting an assigned pixel data index of the read pixel color values for a current line of said graphics image.

10. The method according to claim 8, comprising:

assigning a corresponding sub-CLUT index to each of the sub-CLUTs within a formatted CLUT; and assigning an n-bit value to represent a maximum number of sub-CLUTs within the formatted CLUT, the maximum number of the sub-CLUTs having a value of $2^n$, wherein n is selected from one of 4 and 8.

11. The method according to claim 8, comprising:

assigning a corresponding pixel data index to each of the pixel color values located with the sub-CLUT of said CLUT; and assigning an n-bit value to represent a maximum number of the pixel color values located with the sub-CLUT of said CLUT, the maximum number of the pixel color values having a value of $2^n$, wherein n is selected from one of 4 and 8.

12. The method according to claim 7, comprising:

assigning a corresponding sub-CLUT index to each sub-CLUTs within a formatted CLUT; and assigning a corresponding pixel data index to each pixel color value located within the single sub-CLUT of said CLUT.

13. A method for processing images, the method comprising:

using a graphics processing apparatus for:

updating pixel colors in a color look-up-table (CLUT) being applied to pixels for a graphics image, said updating comprising:

formatting the CLUT into sub-CLUTs, each of the sub-CLUTs providing pixel color values for each of a plurality of pixels representing a line of said graphics image; and assigning a corresponding sub-CLUT index to each of the sub-CLUTs within said formatted CLUT, wherein pixel color values are read from a first selected sub-CLUT of said formatted CLUT during processing of said graphics image, while pixel color values for other sub-CLUTs, which are different from said first selected sub-CLUT of said formatted CLUT, are modified during said processing of said graphics image.

14. The method according to claim 13, comprising reading pixel color values from within a first selected sub-CLUT of said formatted CLUT the first selected sub-CLUT of said formatted CLUT comprising pixel color values for a first line of said graphics image.

15. The method according to claim 14, wherein reading the pixel color values further comprises:

selecting an assigned sub-CLUT index of the CLUT for a first line of said graphics image; and selecting an assigned pixel data index of the read pixel color values for a current line of said graphics image.

16. The method according to claim 13, comprising:

assigning a corresponding sub-CLUT index to each sub-CLUT within said formatted CLUT; and assigning an n-bit value to represent a maximum number of the sub-CLUTs within the formatted CLUT, the maximum number of the sub-CLUTs having a value of $2^n$, wherein n is selected from one of 4 and 8.

17. The method according to claim 13, comprising assigning a corresponding pixel data index to each pixel color value located within the sub-CLUT.

18. The method according to claim 17, wherein assigning a corresponding pixel data index to each of the pixel color values located with the sub-CLUT comprises assigning an n-bit value to represent a maximum number of pixel color values located with the sub-CLUT, the maximum number of the pixel color values having a value of $2^n$, wherein n is selected from one of 4 and 8.

19. The method according to claim 13, comprising applying the read pixel color values to a current first line of said graphics image.

20. A method for processing images, the method comprising:

using a graphics processing apparatus for:

updating pixel colors in a color look-up-table (CLUT) being applied to pixels for a graphics image, said updating comprising:

formatting the CLUT into sub-CLUTs, each of the sub-CLUTs providing pixel color values for each of a plurality of pixels representing a line of said graphics image; and assigning a corresponding pixel data index to each of the pixel color values located within each of the sub-CLUTs of said CLUT, wherein pixel color values are read from a first selected sub-CLUT of said CLUT during processing of said graphics image, while pixel color values for other sub-CLUTs, which are different from said first selected sub-CLUT of said CLUT, are modified during said processing of said graphics image.

21. The method according to claim 20, comprising applying the read pixel color values to a current first line of said graphics image.

22. The method according to claim 20, comprising reading pixel color values from within a first selected sub-CLUT of said CLUT, the first selected sub-CLUT of said CLUT comprising pixel color values for a first line of said graphics image.

23. The method according to claim 22, wherein reading the pixel color values comprises:

selecting an assigned sub-CLUT index of the CLUT for a first line of said graphics image; and selecting an assigned pixel data index of the read pixel color values for a current line of said graphics image.

24. The method according to claim 20, comprising assigning a corresponding sub-CLUT index to each sub-CLUT within a formatted CLUT.

25. The method according to claim 24, comprising:

assigning a corresponding sub-CLUT index to each of the sub-CLUTs within a formatted CLUT; and assigning an n-bit value to represent a maximum number of the sub-CLUTs within the formatted CLUT, the maximum number of the sub-CLUTs having a value of $2^n$, wherein n is selected from one of 4 and 8.

26. The method according to claim 20, comprising: assigning a corresponding pixel data index to each of the pixel color values located with a sub-CLUT; and assigning an n-bit value to represent a maximum number of the pixel color values located with the sub-CLUT, the maximum number of the pixel color values having a value of $2^n$, wherein n is selected from one of 4 and 8.

27. A method for processing images, the method comprising:

using a graphics processing apparatus for:

updating pixel colors in a color look-up-table (CLUT) being applied to pixels for a graphics image, said updating comprising:

formatting said CLUT into sub-CLUTs, each one of said sub-CLUTs providing pixel color values for each of a plurality of pixels representing a line of said graphics image;

reading said pixel color values from within a first selected sub-CLUT of said CLUT, said pixel color values comprising pixel color values for a first line of said graphics image, while pixel color values for other sub-CLUTs of said CLUT, which are different from said first selected sub-CLUT of said CLUT, are modified during processing of said graphics image;

applying the read pixel color values to a current first line of said graphics image; and simultaneously with the applying the read pixel color values to the current first line, updating pixel color values for a second selected sub-CLUT of said CLUT, the second selected sub-CLUT of said CLUT comprising color pixel values for a second line of said graphics image.

28. A method for processing images, the method comprising:

using a graphics processing apparatus for:

updating pixel colors in a color look-up-table (CLUT) being applied to pixels for a graphics image, said updating comprising:

applying read pixel color values from a single sub-CLUT for said CLUT to a current first line of said graphics image, wherein the single sub-CLUT provides pixel color values for each one of a plurality of pixels representing a single line of said graphics image, while pixel color values for other sub-CLUTs of said CLUT, which are different from said single sub-CLUT, are modified during processing of said graphics image; and simultaneously with applying read pixel color values to a current first line, updating pixel color values for a second selected sub-CLUT of said CLUT, the second selected sub-CLUT of said CLUT comprising color pixel values for a second line of said graphics image.

29. A method for processing images, the method comprising:

using a graphics processing apparatus for:

updating pixel colors in a color look-up-table (CLUT) being applied to pixels for a graphics image, said updating comprising:

formatting the CLUT into sub-CLUTs, each of the sub-CLUTs providing pixel color values for each of a plurality of pixels representing a line of said graphics image;

assigning a corresponding sub-CLUT index to each of the sub-CLUTs within a formatted CLUT, wherein pixel color values are read from a first selected sub-CLUT during processing of said graphics image, while pixel color values for other sub-CLUTs, which are different from said first selected sub-CLUT, are modified during said processing of said graphics image; and simultaneously with applying of read pixel color values to a current first line of said graphics image, updating pixel color values for a second selected sub-CLUT, the second selected sub-CLUT comprising color pixel values for a second line of said graphics image.

30. A method for processing images, the method comprising:

using a graphics processing apparatus for:

updating pixel colors in a color look-up-table (CLUT) being applied to pixels for a graphics image, said updating comprising:

formatting the CLUT into sub-CLUTs, each of the sub-CLUTs providing pixel color values for each of a plurality of pixels representing a line of said graphics image;

assigning a corresponding pixel data index to each of the pixel color values located within each of the sub-CLUTs of said CLUT, wherein pixel color values are read from a first selected sub-CLUT of said CLUT during processing of said graphics image, while pixel color values for other sub-CLUTs of said CLUT, which are different from said first selected sub-CLUT, are modified during said processing of said graphics image; and simultaneously with applying the read pixel color values to a current first line, updating pixel color values for a second selected sub-CLUT, the second selected sub-CLUT comprising color pixel values for a second line of said graphics image.

* * * * *